United States Patent
Xiao (10) Patent No.: US 9,716,178 B2
(45) Date of Patent: Jul. 25, 2017

(54) FIN FIELD EFFECT TRANSISTOR AND FABRICATING METHOD THEREOF

(71) Applicant: Semiconductor Manufacturing International (Shanghai) Corporation, Shanghai (CN)

(72) Inventor: Deyuan Xiao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/200,414

(22) Filed: Jul. 1, 2016

(65) Prior Publication Data

US 2017/0005197 A1    Jan. 5, 2017

(30) Foreign Application Priority Data

Jul. 2, 2015    (CN) .......................... 2015 1 0387770

(51) Int. Cl.
*H01L 29/66*   (2006.01)
*H01L 29/78*   (2006.01)
*H01L 29/24*   (2006.01)
*H01L 29/49*   (2006.01)

(52) U.S. Cl.
CPC .......... *H01L 29/7855* (2013.01); *H01L 29/24* (2013.01); *H01L 29/4966* (2013.01); *H01L 29/66969* (2013.01)

(58) Field of Classification Search
CPC ........... H01L 29/7869; H01L 29/66969; H01L 27/1225; H01L 29/24; H01L 29/78696

USPC ......................................................... 257/401
See application file for complete search history.

(56) References Cited

U.S. PATENT DOCUMENTS

2015/0061088 A1* 3/2015 Lee .................... H01L 29/7851
                                                                257/637
2016/0190239 A1* 6/2016 Suk .................... H01L 29/0649
                                                                257/351

OTHER PUBLICATIONS

B. Radisavljevic, et al., Single-Layer MOS2 Transistors, Nature Nanotechnology, vol. 6, pp. 147-150 (2011).

* cited by examiner

*Primary Examiner* — Andy Huynh
(74) *Attorney, Agent, or Firm* — Anova Law Group, PLLC (57) ABSTRACT

In accordance with various embodiments of the disclosed subject matter, a fin field effect transistor and a fabricating method thereof are provided. In some embodiments, the method comprises: providing a semiconductor substrate including a fin part protruded above a surface of the semiconductor substrate; forming a metal sulfide layer on the semiconductor substrate, and across the top and side walls of the fin part, wherein the metal sulfide layer is used as a channel region of the fin field effect transistor; forming a first gate electrode structure on the metal sulfide layer and across the top and side walls of the fin part; and forming a source electrode layer and a drain electrode layer on both sides of the first gate structure respectively.

20 Claims, 7 Drawing Sheets

FIN FIELD EFFECT TRANSISTOR AND FABRICATING METHOD THEREOF

CROSS-REFERENCES TO RELATED APPLICATIONS

This application claims the priority of Chinese patent application No. CN201510387770.0, filed on Jul. 2, 2015, the entire content of which is incorporated herein by reference.

TECHNICAL FIELD

The disclosed subject matter generally relates to semiconductor technology and, more particularly, relates to a fin field effect transistor and a fabricating method thereof.

BACKGROUND

With the rapid development of semiconductor manufacturing technology, the semiconductor devices are desirable to have high component density, and high degree of integration. Transistors, as the basic semiconductor devices, have been widely used. When the component density and the integration degree of the semiconductor devices are increasing, the gate size of transistors is getting smaller. However, a short size of the transistor gates may introduce a short channel effect, and thus may produce leakage current, and ultimately may affect the electrical properties of the semiconductor devices.

In order to overcome the short channel effect and to suppress the leakage current, a multi-gate device, fin field effect transistor (Fin FET), has been developed. A structure of the fin field effect transistor can include: a semiconductor substrate, a fin part, a dielectric layer, a gate structure, a source region and a drain region. The fin structure and the dielectric layer are on a surface of the semiconductor substrate. The dielectric layer covers a part of sidewall of the fin part. A top surface of the dielectric layer is below the top of the fin part. The gate structure is located on the surface of the dielectric layer, the top and the sidewall of the fin part. The source region and the drain region are located in the fin part on both sides of the gate structure.

However, the future development of semiconductor manufacturing technology requires a significant improvement of the performance of the fin field effect transistor.

BRIEF SUMMARY

In accordance with some embodiments of the disclosed subject matter, a fin field effect transistor and a fabricating method thereof are provided.

One aspect of the disclosed subject matter provides a method for forming a fin field effect transistor, comprising: providing a semiconductor substrate including a fin part protruded above a surface of the semiconductor substrate; forming a metal sulfide layer on the semiconductor substrate, and across the top and side walls of the fin part, wherein the metal sulfide layer is used as a channel region of the fin field effect transistor; forming a first gate electrode structure on the metal sulfide layer and across the top and side walls of the fin part; and forming a source electrode layer and a drain electrode layer on both sides of the first gate structure respectively.

In some embodiments, a material of the metal sulfide layer is selected form $MoS_2$, $WS_2$, $MoSe_2$, $WSe_2$, $MoTe_2$, $WTe_2$ and a combination thereof.

In some embodiments, the metal sulfide layer is formed by using one of an atomic layer deposition process, an atomic layer epitaxy process, a metal organic chemical vapor deposition process, and a spin-coating process.

In some embodiments, the spin-coating process comprises: providing a hydrazine-based solution containing a metal and a chalcogen used for forming the metal sulfide layer; spin-coating the hydrazine-based solution on a surface of the semiconductor substrate including the fin part; processing the hydrazine-based solution on the surface of the semiconductor substrate to volatilize a solvent of the hydrazine-based solution; and performing a thermal treatment for the metal to react with chalcogen in the hydrazine-based solution to form the metal sulfide layer.

In some embodiments, a thickness of the metal sulfide layer is 5 nm to 10 nm.

In some embodiments, the method further comprises: before forming the first gate electrode structure, forming a transition layer covering the metal sulfide layer, wherein a conduction band of the transition layer is 0.2 eV to 0.6 eV higher than a conduction band of the metal sulfide layer.

In some embodiments, a material of the transition layer is a metal oxide layer selected from titanium oxide, hafnium oxide, aluminum oxide, and a combination thereof.

In some embodiments, a thickness of the transition layer is in a range of 1 nm to 2 nm.

In some embodiments, the transition layer is formed by using an atomic layer deposition process or a metal organic chemical vapor deposition process.

In some embodiments, the source electrode layer comprises a source buffer layer on the transition layer, and a source contact layer on the source buffer layer; and the drain electrode layer comprises a drain buffer layer on the transition layer, and a drain contact layer on the drain buffer layer.

In some embodiments, a metal material of the source buffer layer and the drain buffer layer corresponds to a metal in the metal oxide material of the transition layer, wherein the metal material is selected from titanium, hafnium, aluminum, and a combination thereof; and a material of the source contact layer and the drain contact layer is copper.

In some embodiments, a thickness of the source buffer layer is 40 nm to 60 nm; a thickness of the source contact layer is 3 nm to 10 nm; a thickness of the drain buffer layer is 40 nm to 60 nm; and a thickness of the drain contact layer is 3 nm to 10 nm.

In some embodiments, the method further comprises: before forming the metal sulfide layer, forming a second gate electrode structure on the metal sulfide layer and across the top and side walls of the fin part.

In some embodiments, forming the second gate electrode structure comprises: doping a portion of the semiconductor substrate including the fin part to form a second gate electrode layer; and forming a second gate oxide layer on the semiconductor substrate and across the top and side walls of the fin part.

In some embodiments, a material of the second gate oxide layer is selected from titanium oxide, hafnium oxide, aluminum oxide, and a combination thereof.

In some embodiments, the second gate oxide layer is formed by an atomic layer deposition process or a metal organic chemical vapor deposition process.

In some embodiments, the first gate electrode structure comprises: a first gate oxide layer across the top and side walls of the fin part; a first gate electrode layer on the first gate oxide layer; and sidewalls on both sides of the first gate electrode layer.

In some embodiments, a material of the first gate oxide layer is selected from titanium oxide, hafnium oxide, aluminum oxide, and a combination thereof.

Another aspect of the disclosed subject matter provides a fin field effect transistor, comprising: a semiconductor substrate including a fin part protruded above a surface of the semiconductor substrate; a metal sulfide layer on the semiconductor substrate, and across the top and side walls of the fin part, wherein the metal sulfide layer is used as a channel region of the fin field effect transistor; a first gate electrode structure on the metal sulfide layer and across the top and side walls of the fin part; and a source electrode layer and a drain electrode layer on both sides of the first gate structure respectively.

In some embodiments, the fin field effect transistor further comprises: a transition layer covering the metal sulfide layer; and a second gate electrode structure on the metal sulfide layer and across the top and side walls of the fin part.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of one disclosure.

In some embodiments, the disclosed subject matter provides a non-planar semiconductor device comprising a source electrode, a drain electrode and semiconducting layer with a two-dimensional consisting of a single or double two-dimensional layer(s) made from one of the following materials: $MoS_2$, $WS_2$, $MoS_2$, $MoSe_2$, $WS_2$, $WSe_2$, $MoTe_2$ or $WTe_2$ as channel material fabricated on Silicon Substrate. Hafnium dioxide is used as a gate insulator for both of the front-gate and back-gate. A very thin $TiO_2$ layer (about 2 nm) is inserted between contact metals and $MoS_2$ channel to lower the SBH thus to achieve a low contact resistance.

The use of individual two-dimensional semiconducting layers can reduce this power dissipation because the two-dimensional geometry of the semiconducting layer results in improved electrostatic control of the gate electrode and reduction of short channel effects when compared to thick semiconducting layers. Smallest allowable channel length is proportional to square root of material thickness, so by using a thinner material one can fabricate a transistor with a shorter channel. In the case of single-layer $MoS_2$, 0.65 nm thick, a transistor with a channel 1.5 nm long is still functional.

Conventional fin FET may include dangling bonds at the interface between the gate structure and the fin FET. The dangling bonds can affect a carrier mobility of the channel region, thus affecting the performance of the fin field-effect transistor.

A further analysis shows that, a fin part in the existing technique is formed by etching a silicon substrate. Although the silicon crystal has a regular tetrahedron structure, after forming a fin part, numerous chemical bonds on the surface of the fin part are interrupted. Therefore, multiple dangling bonds are formed on the surface of the fin part. That is, due to the molecular structure of silicon crystal of the fin part, dangling bonds can be generated.

As disclosed, metal sulfide material(s) may be used for forming a Fin FET. For example, $MoS_2$ material, as an example of metal sulfide material, may have two types of crystal structures: hexagonal crystal, and triangular crystal.

In a hexagonal crystal, the crystal orientations of adjacent molecular layers are perpendicular with each other. In each molecular layer, the S—Mo—S atoms form a "sandwich" structure. A plane hexagonal Mo-atom layer is between two S-atom layers. Specifically, in the crystal, each S-atom is equidistant with three neighboring Mo-atoms. The S atom is located on the top corner of a triangular prism. The lengths of the prism sides are 0.317 nm and 0.315 nm respectively. Each Mo-atom is surrounded by six equidistant S-atoms. A distance between adjacent Mo-atom and S-atom is 0.241 nm. The S-atoms and the Mo-atoms are stably bonded by covalent bond. The crystal orientations of all the crystal layers in the triangular crystal are parallel.

Both hexagonal $MoS_2$ crystal and triangular $MoS_2$ crystal have a typical characteristic of a layered structure: a two-dimensional geometry.

Accordingly, the disclosed subject matter provides a new type of fin field effect transistor. In one embodiment, the fin field effect transistor uses the hexagonal $MoS_2$ crystal and/or triangular $MoS_2$ crystal instead of silicon crystal as a channel region. The disclosed fin field effect transistor effectively eliminates the dangling bonds, thereby has an increased carrier mobility of the channel region.

The disclosed subject matter further provides a method for fabricating the fin field effect transistor. In one embodiment, the method can use $MoS_2$ as a channel region of the fin field effect transistor. The method improves the carrier mobility of the channel region, mitigates the short channel effect, and improves the performance of the fin field effect transistor.

Figure 1:
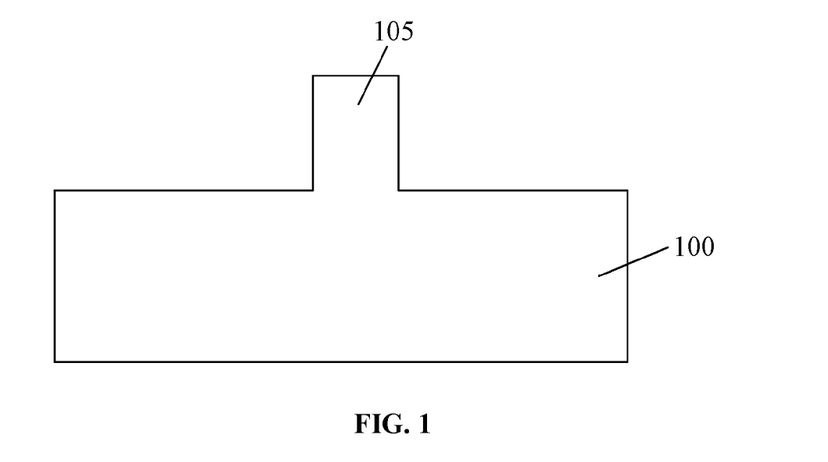
FIGS. 1-12 illustrate cross sectional structures of an exemplary fin field effect transistor corresponding to certain stages of a fabricating process in accordance with various disclosed embodiments.
Figure 2:
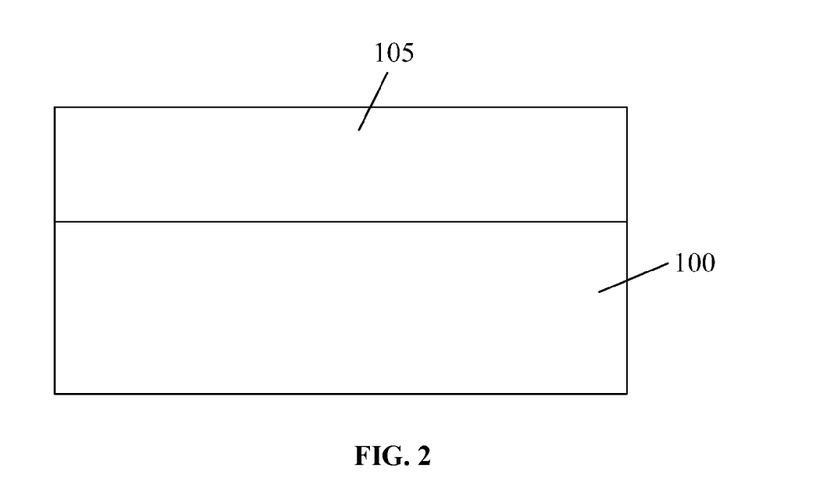

Referring to FIGS. 1 and 2, FIG. 1 shows a cross sectional view perpendicular to the longitudinal direction of the channel region of an exemplary fin FET, while FIG. 2 shows a cross sectional view along the longitudinal direction of the channel region of an exemplary fin FET.

As illustrated, a semiconductor substrate 100 can be provided. A fin part 105 is protruded above the surface of the semiconductor substrate 100.

The semiconductor substrate 100 is used as a platform for the subsequent process. The semiconductor substrate 100 can be any suitable substrate, such as a silicon substrate, a silicon germanium substrate, a silicon carbide substrate, a silicon-on-insulator substrate, a germanium-on-insulator substrate, a glass substrate, a group III-V compound substrate including a gallium arsenide substrate and a gallium nitride substrate, or any other suitable type of substrate. In one embodiment of the disclosed subject matter, the semiconductor substrate 100 is a silicon substrate.

The fin part 105 is configured for forming a fin FET. The fin part 105 can be formed by etching the semiconductor substrate 100. In one embodiment, the fin part 105 can be formed by a dry etching process.

Figure 3:
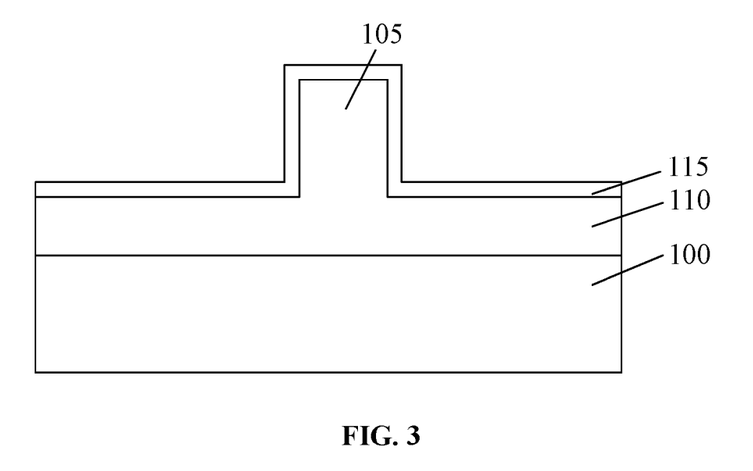
Figure 4:
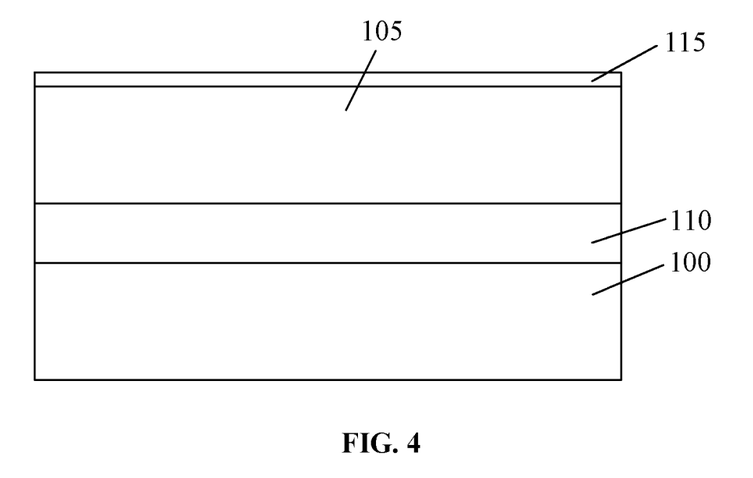

Referring to FIGS. 3 and 4, FIG. 3 shows a cross sectional view perpendicular to the longitudinal direction of the channel region of the fin FET, while FIG. 4 shows a cross sectional view along the longitudinal direction of the channel region of the fin FET.

As illustrated, a second gate electrode layer 110 can be formed by doping a portion of the semiconductor substrate 100 including the fin part 105. A second gate oxide layer 115 can be formed on the surface of the semiconductor substrate 100 and across the top and side walls of fin part 105. The second gate oxide layer 115 and the second gate electrode layer 110 constitute the second gate structure.

In some typical existing fin FETs, only a first gate structure is formed by depositing on the surface of the fin part 105. In some embodiments of the disclosed subject matter, a second gate structure opposite with the first gate structure can be formed by doping. An advantage is that a specific voltage with different predetermined value can be selected to apply to either the first gate structure or the second gate structure in some subsequent processes. Therefore, the formed fin field effect transistor has a flexibility to have optional threshold voltage.

The second gate electrode layer 110 can be used as a gate electrode of the second gate structure. The second gate electrode 110 is doped with ions, and is conductive.

The second gate oxide layer 115 can be used as a dielectric layer of the second gate structure for isolating the second gate electrode layer 110 and a channel region of the fin FET. The channel region of the fin FET is a metal sulfide layer formed in a subsequent step. The second gate oxide layer 115 can be formed by a deposition process, such as a metal organic chemical vapor deposition process, or an atomic layer deposition process. A material of the second gate oxide layer 115 can be any suitable high-K dielectric, such as titanium oxide, hafnium oxide, and/or aluminum oxide. A thickness of the second gate oxide layer 115 is about 2 nm to 20 nm. In one embodiment, the second gate oxide layer 115 is made of titanium, formed by metal organic chemical vapor deposition process, and has a thickness of 2 nm.

It should be noted that in some other embodiments of the disclosed subject matter, the second gate structure is optional. That is, only the first gate structure is formed.

Figure 5:
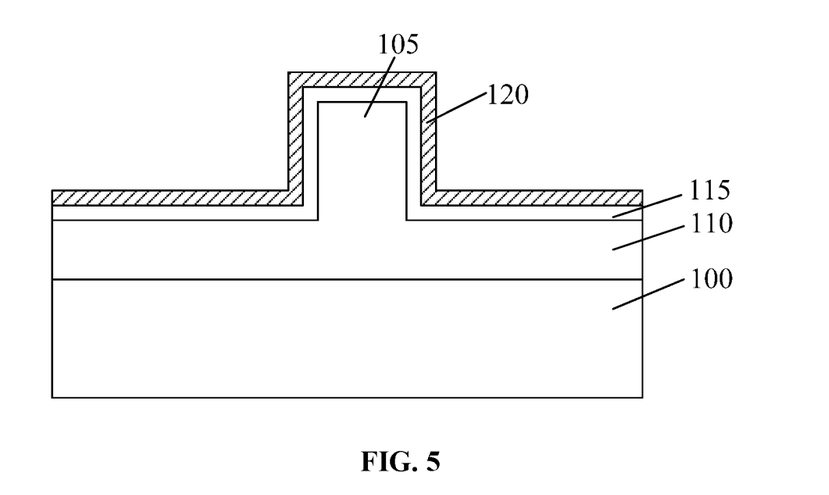
Figure 6:
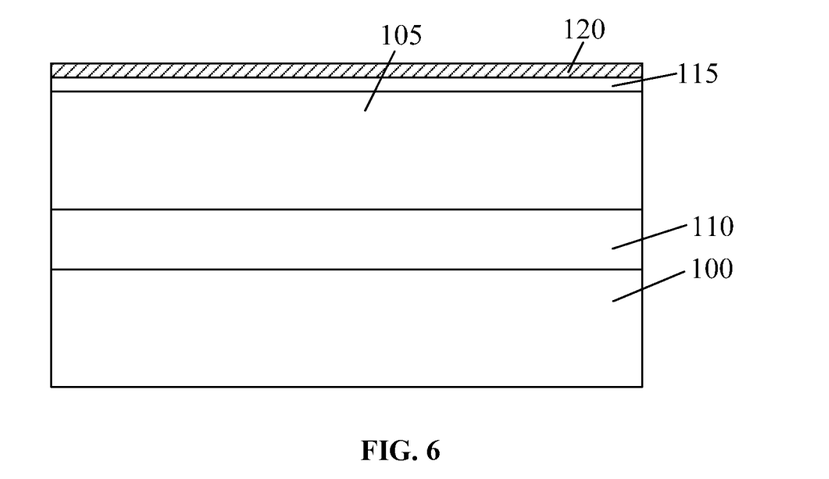

Referring to FIGS. 5 and 6, FIG. 5 shows a cross sectional view perpendicular to the longitudinal direction of the channel region of the fin FET, while FIG. 6 shows a cross sectional view along the longitudinal direction of the channel region of the fin FET.

A metal sulfide layer 120 is formed on the surface of the semiconductor substrate 100, and across the top and side walls of the fin part 105. The metal sulfide layer 120 can be used as a channel region of the fin field effect transistor.

As mentioned above, the $MoS_2$ crystal has a typical layered structure, with two-dimensional geometry. In each molecular layer, the S—Mo—S atoms form a "sandwich" structure. The Mo atoms and the S atoms are arranged in hexagonal symmetry. Atoms in each molecular layer are bonded by strong covalent bonds. Molecular layers are bonded by weak van der Waals forces. By using the $MoS_2$ instead of silicon as the channel region of a fin field effect transistor, the dangling bonds mentioned above can be effectively eliminated. Therefore, a carrier mobility of the channel region of a fin field effect transistor can be increased.

It should be noted that, metal chalcogenides, including $MoS_2$, $WS_2$, $MoSe_2$, $WSe_2$, $MoTe_2$, and/or $WTe_2$, have similar two-dimensional layered crystal structure, so that the metal chalcogenides can be used, instead of the semiconductor substrate material, as the channel region.

The metal sulfide layer 120 is on the surface of the semiconductor substrate 100, and across the top and side walls of the fin part 105. The metal sulfide layer 120 can be used as a channel region of a field effect transistor in the subsequent steps.

The material of the metal sulfide layer 120 can be $MoS_2$, $WS_2$, $MoSe_2$, $WSe_2$, $MoTe_2$, $WTe_2$, or any other suitable metal sulfides. The metal sulfide layer 120 can be formed by any suitable method, such as an atomic layer deposition process, an atomic layer epitaxy process, a metal organic chemical vapor deposition process, or a spin-coating process.

In one embodiment, the metal sulfide layer 120 has a material of $MoS_2$, and is formed by a spin-coating process. The spin-coating process can include the following steps: providing a hydrazine-based solution including the metal element(s) and chalcogen element(s) of the metal sulfide; spin-coating the hydrazine-based solution on the surface of the semiconductor substrate 100 including the surface of the fin part 105; processing the hydrazine-based solution on the surface of the semiconductor substrate 100 to volatilize the solvent; performing a thermal treatment such that the metal element(s) reacts with chalcogen element(s) in the hydrazine-based solution to form a metal sulfide layer 120 on the surface of the semiconductor substrate 100, and across the top and side walls of the fin part 105.

It should be noted that, a thickness of the metal sulfide layer 120 can affect a minimum length of the channel region of the fin FET. Particularly, a smaller thickness the metal sulfide layer 120 in the channel region means a shorter minimum length of the channel region of the fin FET, and can better reduce the short-channel effect. Further, taking into account the process limits to form the metal sulfide layer 120, the thickness of the metal sulfide layer 120 can be about 5 nm to 10 nm. In one embodiment of the disclosed subject matter, the thickness of the metal sulfide layer 120 is 5 nm.

Figure 7:
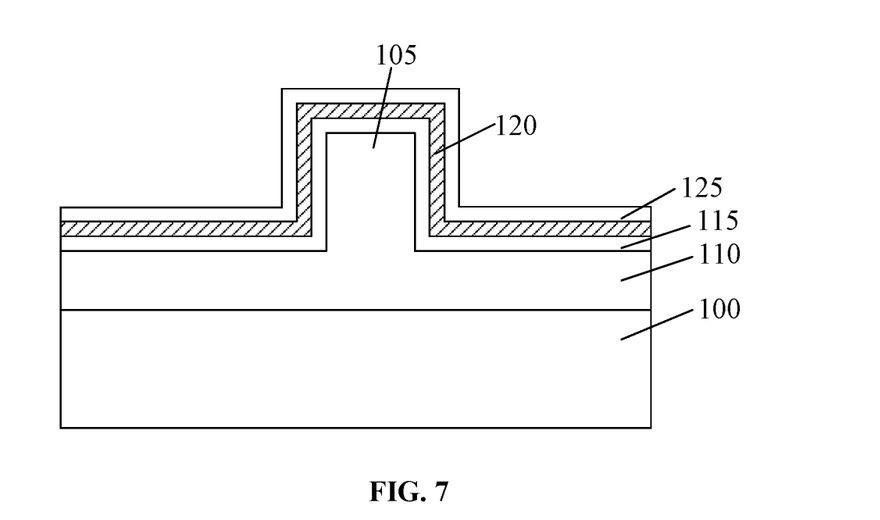
Figure 8:
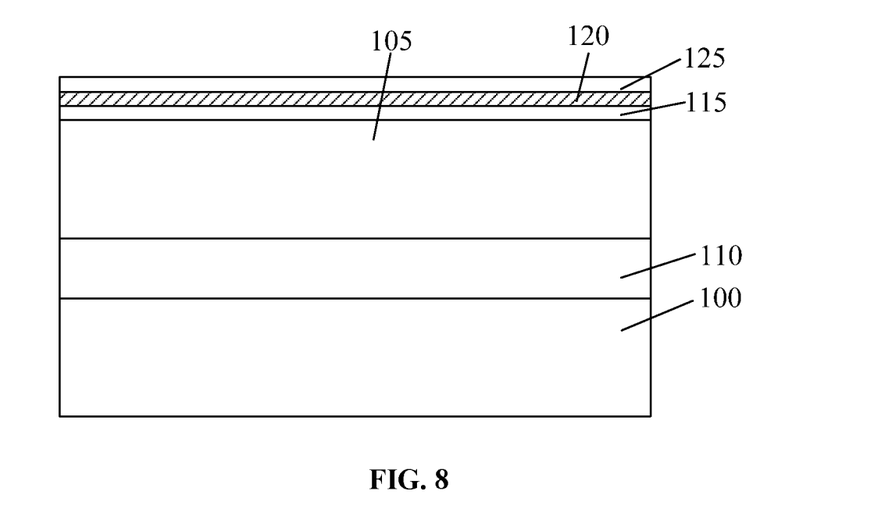

Referring to FIGS. 7 and 8, FIG. 7 shows a cross sectional view perpendicular to the longitudinal direction of the channel region of the fin FET, while FIG. 8 shows a cross sectional view along the longitudinal direction of the channel region of the fin FET.

As illustrated, a transition layer 125 can be formed to cover the surface of the metal sulfide layer 120. A conduction band of the transition layer 125 is about 0.2 eV to 0.6 eV higher than a conduction band of the metal sulfide layer 120.

Since it is difficult to dope the metal sulfide layer 120 due to the two-dimensional layered structure, a source electrode layer and a drain electrode layer are subsequently formed using a deposition process rather than a doping process.

If the material of the source electrode layer and the drain electrode layer is in direct contact with the metal sulfide layer 120, a contact resistance can be too large to be conducive to form a fin FET having superior performance. Thus, a transition layer 125 can be formed between the source electrode layer and the metal sulfide layer 120, and between the drain electrode layer and the metal sulfide layer 120. The transition layer 125 can reduce the contact resistance between the source electrode layer and the metal sulfide layer 120, and reduce the contact resistance between the drain electrode layer and the metal sulfide layer 120.

A conduction band of the transition layer 125 is about 0.2 eV to 0.6 eV higher than a conduction band of the metal sulfide layer 120. A contact interface between the transition layer 125 and the metal sulfide layer 120 can constitute a Schottky barrier. Therefore in a subsequent step, a small voltage applied on the first gate structure can make the carriers migrate from the source region to the drain region.

The material of the transition layer 125 can be any suitable high K dielectric, such as titanium oxide, hafnium oxide, and/or aluminum oxide. A thickness of the transition layer 125 can be 1 nm to 2 nm. The transition layer 125 can be formed by a metal organic chemical vapor deposition process, or an atomic layer deposition process. In one embodiment, the oxide transition layer 125 contains a titanium material of about 2 nm thick, and is formed by a metal organic chemical vapor deposition process.

It should be noted that, in some embodiments, to minimize process steps and make the structure of the fin FET more compact, the transition layer 125 can be used as a first gate oxide layer of the first gate structure for isolating the metal sulfide layer 120 and a first gate electrode layer formed in a subsequent step.

It also should be note that, in some other embodiments, forming a transition layer 125 may be an optional step. That is, only the first gate oxide layer is formed on the surface of the metal sulfide surface 120.

Figure 9:
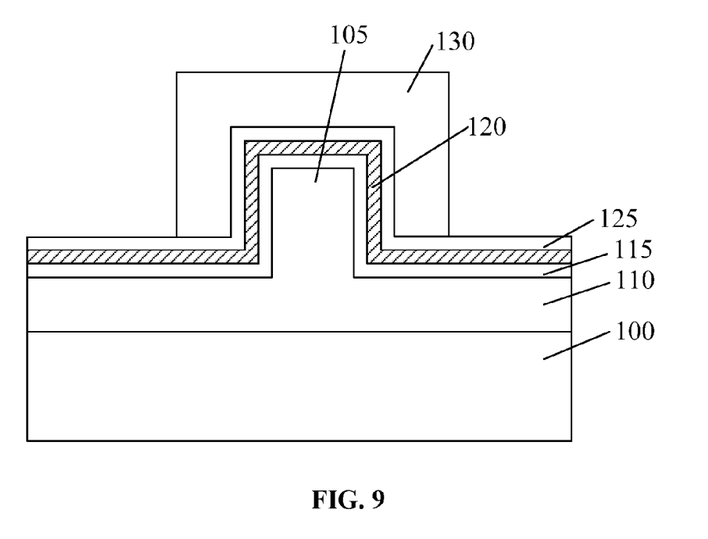
Figure 10:
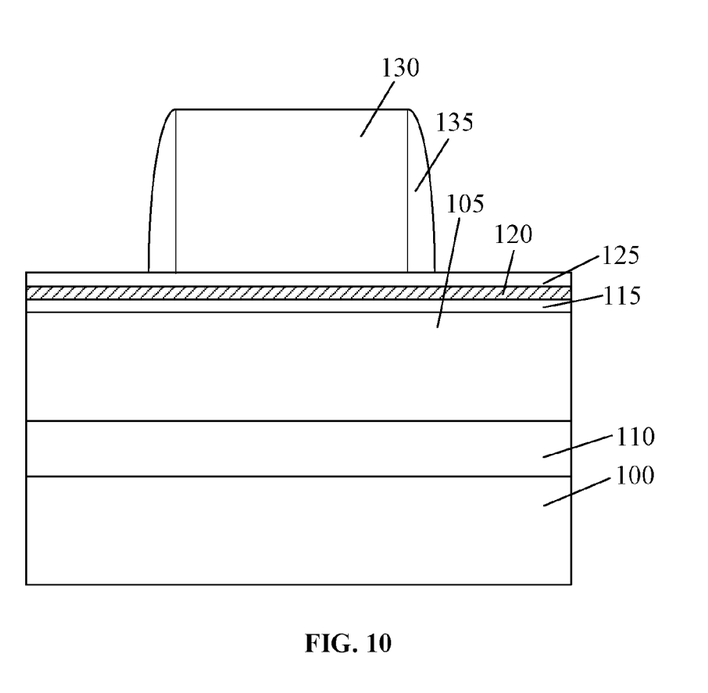

Referring to FIGS. 9 and 10, FIG. 9 shows a cross sectional view perpendicular to the longitudinal direction of the channel region of the fin FET, while FIG. 10 shows a cross sectional view along the longitudinal direction of the channel region of the fin FET.

As illustrated, a first gate electrode layer 130 is formed on the surface of the transition layer 125. Sidewalls 135 are formed on both sides of the first gate electrode layer 130.

As previously described, the transition layer 125 can be used as the first gate oxide layer of the first gate structure. Thus, in some embodiments, the first gate electrode layer 130 can be directly formed on the surface of the transition layer 125.

The first gate electrode layer 130 can be formed by using any suitable deposition process, such as an atomic layer deposition process. A process for forming the first gate electrode layer 130 can include the following steps: forming a first gate electrode thin film covering the surface of the transition layer 125; forming a photoresist layer (not shown in the figures) on the surface of the first gate electrode thin film, where the photoresist layer defines the positions of the first gate structure; using the photoresist layer as a mask, etching the first gate electrode thin film to expose the surface of the transition layer 125 to form a first gate electrode layer 130 on the surface of the transition layer 125.

The material of the first gate electrode layer 130 can be any suitable metallic material, such as copper, gold, aluminum, or a combination thereof. A thickness of the first gate electrode layer 130 is about 100 nm to 300 nm.

It should be noted that, in some other embodiments, no transition layer 125 is formed, and a first gate oxide layer is formed directly on the surface of the metal sulfide layer 120. In these embodiments, a process for forming the first gate electrode layer 130 can include the following steps: forming a photoresist layer can be used as a mask; successively etching the gate electrode film and the first gate oxide film to expose the metal sulfide layer 120, and forming the first gate electrode layer 130 that covers the first gate oxide layer.

The sidewalls 135 are used for isolating the first gate electrode layer 130 and the source electrode layer, as well as the first gate electrode layer 130 and the drain electrode layer.

The sidewalls 135 can be formed by performing a deposition process. A specific formation process of the sidewalls 135 can include the following steps: forming a sidewall thin film that covers the top and side walls of the first gate electrode layer 130 and covers the transition layer 125; and etching the sidewall thin film to form the sidewalls 135 that are located on both sides of the first gate electrode layer 130.

In some embodiments of the disclosed subject matter, the first gate structure includes a portion of the transition layer 125 that is located in the bottom of the first gate electrode layer 130, the first gate electrode layer 130, and the sidewalls 135.

It should be noted that, in some other embodiments, no buffer layer is formed, and the first gate oxide layer is formed directly on the surface of the metal sulfide layer 120. In these embodiments, a specific process for forming of the sidewalls 135 can include the following steps: forming a sidewall thin film that covers the top and side walls of the first gate electrode layer 130 and covers the metal sulfide layer 120; and etching the sidewall thin film to form the sidewalls 135 that are located on both sides of the first gate electrode layer 130 and the first gate oxide layer.

Figure 11:
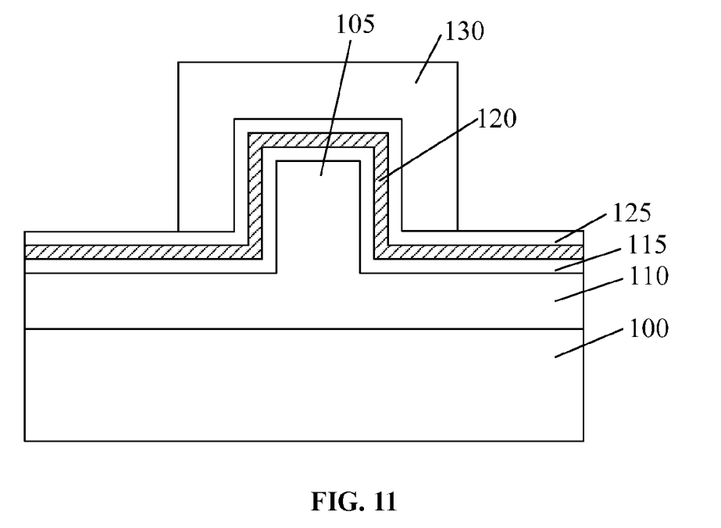
Figure 12:
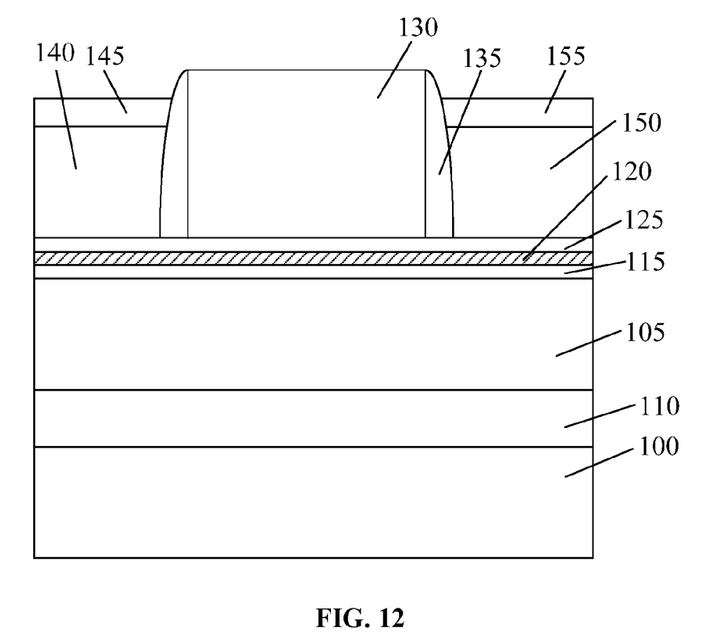

Referring to FIGS. 11 and 12, FIG. 11 shows a cross sectional view perpendicular to the longitudinal direction of the channel region of the fin FET, while FIG. 12 shows a cross sectional view along the longitudinal direction of the channel region of the fin FET.

As illustrated, a source electrode layer and a drain electrode layer are formed on both sides of the first gate structure respectively. The source electrode layer and a drain electrode layer are used as a source electrode and a drain electrode of the fin field effect transistor.

The source electrode layer and the drain electrode layer can be formed by any suitable deposition process. In some embodiments, in order to further reduce the contact resistance between the source electrode and transition layer 125, and the contact resistance between the drain electrode layer and the transition layer 125, the source electrode layer and the drain electrode layer can have multilayer stack structure.

Particularly, the source electrode layer includes a source buffer layer 140 on the transition layer 125, and a source contact layer 145 on the source buffer layer 140; the drain electrode layer includes a drain buffer layer 150 on the transition layer 125, and a drain contact layer 155 on the drain buffer layer 150.

A thickness of the source buffer layer 140 is about 40 nm to 60 nm, and a thickness of the source contact layer 145 is about 3 nm to 10 nm. A thickness of the drain buffer layer 150 is about 40 nm to 60 nm, and a thickness of the drain contact layer 155 is about 3 nm to 10 nm. In one embodiment, the source of the buffer layer 140 of 50 nm thickness, the source buffer layer 140 and the drain buffer layer 150 have a 50 nm thickness, while the source contact layer 145 and the drain contact layer 155 have a 5 nm thickness of 5 nanometers.

In some embodiments, the source buffer layer 140 and the drain buffer layer 150 have a metal material that corresponds to the metal oxide material of the transition layer 125. For example, the source buffer layer 140 and the drain buffer layer 150 have a metal material such as titanium, hafnium or aluminum. The source contact layer 145 and the drain contact layer 155 are made of copper material.

In one embodiment, the transition layer 125 is made of titanium oxide, the source buffer layer 140 and the drain buffer layer 150 are made of titanium, and the source contact layer 145 and the drain contact layer 155 are made of copper.

It should be noted that, in some other embodiments, the source electrode layer and the drain electrode layer may have a single layer structure.

Figure 13:
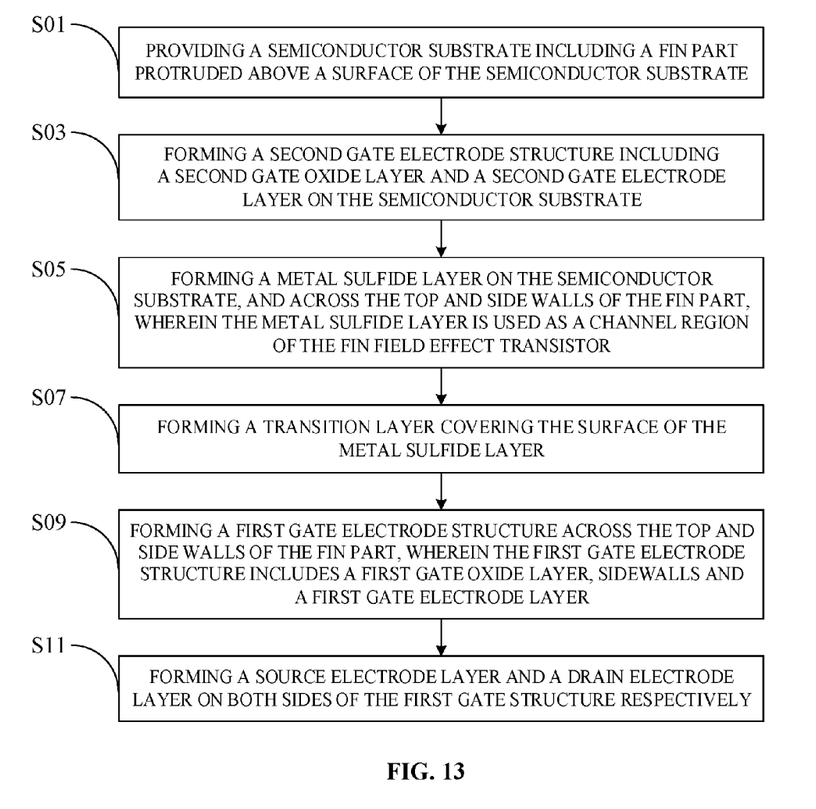
FIG. 13 illustrates a flow chart of an exemplary method for fabricating a fin field effect transistor in accordance with various disclosed embodiments.

Referring to FIG. 13, a flow chart of a method for fabricating a fin field effect transistor is shown in accordance with some embodiments of the disclosed subject matter.

As illustrated, the method can include the following steps.

Step S01: providing a semiconductor substrate including a fin part protruded above a surface of the semiconductor substrate;

Step S03: forming a second gate electrode structure including a second gate oxide layer and a second gate electrode layer on the semiconductor substrate;

Step S05: forming a metal sulfide layer on the semiconductor substrate, and across the top and side walls of the fin part, wherein the metal sulfide layer is used as a channel region of the fin field effect transistor;

Step S07: forming a transition layer covering the surface of the metal sulfide layer;

Step S09: forming a first gate electrode structure across the top and side walls of the fin part, wherein the first gate electrode structure includes a first gate oxide layer, sidewalls and a first gate electrode layer;

Step S11: forming a source electrode layer and a drain electrode layer on both sides of the first gate structure respectively.

It should be noted that the above steps of the flow diagram of FIG. 13 can be executed or performed in any order or sequence not limited to the order and sequence shown and described in the figure. Also, some of the above steps of the flow diagram of FIG. 13 can be executed or performed substantially simultaneously where appropriate or in parallel to reduce latency and processing times. Furthermore, it should be noted that FIG. 13 is provided as an example only. At least some of the steps shown in the figure may be performed in a different order than represented, performed concurrently, or altogether omitted.

Accordingly, a fin field effect transistor using a metal sulfide layer as a channel region can be formed by the disclosed method. Due to the two-dimensional layered structure of the metal sulfide layer, dangling bonds at the interface between the surface of the fin part and the first gate structure can be effectively eliminated. Therefore, the formed fin field effect transistor has an increased carrier mobility of the channel region.

Further, since a second gate structure opposite to the first gate structure has been formed, a specific voltage with different predetermined value can be selected to apply to either the first gate structure or the second gate structure. Therefore, the formed fin field effect transistor has a flexibility to have optional threshold voltage.

Furthermore, a transition layer covering the metal sulfide layer can be formed. A conduction band of the transition layer is about 0.2 eV to 0.6 eV higher than a conduction band of the metal sulfide layer. A contact interface between the transition layer and the metal sulfide layer can constitute a Schottky barrier. Therefore, a small voltage applied on the first gate structure can make the carriers migrate from the source region to the drain region. Also, the transition layer can reduce the contact resistance between the source electrode layer and the metal sulfide layer, and reduce the contact resistance between the drain electrode layer and the metal sulfide layer.

In some embodiments of the disclosed subject matter, a fin FET can be provided. Referring back to FIGS. 11 and 12, the fin FET can include:

A semiconductor substrate 100, including a fin part 105 protruded above the surface of the semiconductor substrate 100.

A metal sulfide layer 120 formed on the surface of the semiconductor substrate 100, and across the top and side walls of the fin part 105. The metal sulfide layer 120 is used as a channel region of the fin field effect transistor.

A first gate structure cross the top and the side walls of the fin part 105.

A source electrode layer and a drain electrode layer located on both sides of the first gate structure.

In some embodiments, the semiconductor substrate 100 can be any suitable substrate, such as a silicon substrate, a silicon germanium substrate, a silicon carbide substrate, a silicon-on-insulator substrate, a germanium-on-insulator substrate, a glass substrate, a group III-V compound substrate including a gallium arsenide substrate and a gallium nitride substrate, and/or any other suitable type of substrate. In one embodiment of the disclosed subject matter, the semiconductor substrate 100 is a silicon substrate.

The fin part 105 can be formed by etching the semiconductor substrate 100. The fin part 105 and the semiconductor substrate 100 may be made of a same material. In one embodiment, the material of the fin part 105 is silicon.

The material of the metal sulfide layer 120 can be $MoS_2$, $WS_2$, $MoSe_2$, $WSe_2$, $MoTe_2$, $WTe_2$, or any other suitable metal sulfide that has a two-dimensional layered structure. A thickness of the metal sulfide layer 120 is about 5 nm to 10 nm. In one embodiment, the material of the metal sulfide layer 120 is $MoS_2$, and the thickness of the metal sulfide layer 120 is 5 nm.

It should be noted that, the disclosed fin FET can further include: a second gate electrode layer 110 in the semiconductor substrate 100; a second gate oxide layer 115 on the surface of the semiconductor substrate 100, and across the top and side walls of the fin part 105, the metal sulfide layer 120 covers the surface of the second gate oxide layer 115.

In some embodiments, the first gate structure includes: a first gate oxide layer on the surface of the metal sulfide layer 120; a first gate electrode layer 130 covers the first gate oxide layer; and sidewalls 135 covering at least the side walls of the first gate electrode layer 130.

In one embodiment, the transition layer 125 is on the surface of the metal sulfide layer 120. The transition layer 125 is used as a gate oxide layer, and also serves to reduce the contact resistance between the channel region and the source electrode layer, as well as the contact resistance between the channel region and the drain electrode layer. The sidewalls 135 covers only the side walls of the first gate electrode layer 130.

The source electrode layer and a drain electrode layer are used as a source electrode and a drain electrode of the fin field effect transistor. In some embodiments, the source electrode layer includes a source buffer layer 140 on the transition layer 125, and a source contact layer 145 on the source buffer layer 140; the drain electrode layer includes a drain buffer layer 150 on the transition layer 125, and a drain contact layer 155 on the drain buffer layer 150.

The disclosed fin field effect transistor has a high carrier mobility of the channel region, because the material of the channel region is a metal sulfide that has a two-dimensional layered structure. Further, the transition layer can not only reduce the contact resistance between the source electrode layer and the metal sulfide layer, and reduce the contact resistance between the drain electrode layer and the metal sulfide layer, but also be used as a first gate oxide layer. As such, the disclosed fin field effect transistor has a compact size, which can increase the degree of integration of the semiconductor products.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a fin field effect transistor and a fabricating method thereof are provided.

Although the disclosed subject matter has been described and illustrated in the foregoing illustrative embodiments, it is understood that one disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of one disclosure.

What is claimed is:

1. A method for forming a fin field effect transistor, comprising:
   providing a semiconductor substrate including a fin part protruded above a surface of the semiconductor substrate;
   forming a metal sulfide layer having a hexagonal or triangular crystal structure arranged in a two-dimensional geometry on the semiconductor substrate, and across the top and side walls of the fin part, wherein the metal sulfide layer is used as a channel region of the fin field effect transistor;
   forming a first gate electrode structure on the metal sulfide layer and across the top and side walls of the fin part; and
   forming a source electrode layer and a drain electrode layer on both sides of the first gate electrode structure respectively.

2. The method of claim 1, wherein a material of the metal sulfide layer is selected form $MoS_2$, $WS_2$, $MoSe_2$, $WSe_2$, $MoTe_2$, $WTe_2$ and a combination thereof.

3. The method of claim 1, wherein the metal sulfide layer is formed by using one of an atomic layer deposition process, an atomic layer epitaxy process, a metal organic chemical vapor deposition process, and a spin-coating process.

4. The method of claim 3, wherein the spin-coating process comprises:
   providing a hydrazine-based solution containing a metal and a chalcogen used for forming the metal sulfide layer;
   spin-coating the hydrazine-based solution on a surface of the semiconductor substrate including the fin part;
   processing the hydrazine-based solution on the surface of the semiconductor substrate to volatilize a solvent of the hydrazine-based solution; and
   performing a thermal treatment for the metal to react with chalcogen in the hydrazine-based solution to form the metal sulfide layer.

5. The method of claim 1, wherein a thickness of the metal sulfide layer is 5 nm to 10 nm.

6. A method for forming a fin field effect transistor, comprising:
   providing a semiconductor substrate including a fin part protruded above a surface of the semiconductor substrate;
   forming a metal sulfide layer on the semiconductor substrate, and across the top and side walls of the fin part, wherein the metal sulfide layer is used as a channel region of the fin field effect transistor;
   forming a transition layer covering the metal sulfide layer;
   forming a first gate electrode structure on the metal sulfide layer and across the top and side walls of the fin part; and
   forming a source electrode layer and a drain electrode layer on both sides of the first gate electrode structure respectively,
   wherein a conduction band of the transition layer is 0.2 eV to 0.6 eV higher than a conduction band of the metal sulfide layer.

7. The method of claim 6, wherein a material of the transition layer is a metal oxide layer selected from titanium oxide, hafnium oxide, aluminum oxide, and a combination thereof.

8. The method of claim 6, wherein a thickness of the transition layer is in a range of 1 nm to 2 nm.

9. The method of claim 6, wherein the transition layer is formed by using an atomic layer deposition process or a metal organic chemical vapor deposition process.

10. The method of claim 6, wherein:
    the source electrode layer comprises a source buffer layer on the transition layer, and a source contact layer on the source buffer layer; and
    the drain electrode layer comprises a drain buffer layer on the transition layer, and a drain contact layer on the drain buffer layer.

11. The method of claim 10, wherein:
    a metal material of the source buffer layer and the drain buffer layer corresponds to a metal in the metal oxide material of the transition layer, wherein the metal material is selected from titanium, hafnium, aluminum, and a combination thereof; and
    a material of the source contact layer and the drain contact layer is copper.

12. The method of claim 10, wherein:
    a thickness of the source buffer layer is 40 nm to 60 nm;
    a thickness of the source contact layer is 3 nm to 10 nm;
    a thickness of the drain buffer layer is 40 nm to 60 nm; and
    a thickness of the drain contact layer is 3 nm to 10 nm.

13. The method of claim 1, further comprising:
    before forming the metal sulfide layer, forming a second gate electrode structure on the metal sulfide layer and across the top and side walls of the fin part.

14. The method of claim 13, wherein forming the second gate electrode structure comprises:
    doping a portion of the semiconductor substrate including the fin part to form a second gate electrode layer; and
    forming a second gate oxide layer on the semiconductor substrate and across the top and side walls of the fin part.

15. The method of claim 14, wherein a material of the second gate oxide layer is selected from titanium oxide, hafnium oxide, aluminum oxide, and a combination thereof.

16. The method of claim 14, wherein the second gate oxide layer is formed by an atomic layer deposition process or a metal organic chemical vapor deposition process.

17. The method of claim 1, wherein the first gate electrode structure comprises:
   a first gate oxide layer across the top and side walls of the fin part;
   a first gate electrode layer on the first gate oxide layer; and
   sidewalls on both sides of the first gate electrode layer.

18. The method of claim 17, wherein a material of the first gate oxide layer is selected from titanium oxide, hafnium oxide, aluminum oxide, and a combination thereof.

19. A fin field effect transistor, comprising:
   a semiconductor substrate including a fin part protruded above a surface of the semiconductor substrate;
   a metal sulfide layer on the semiconductor substrate, and across the top and side walls of the fin part, wherein the metal sulfide layer is used as a channel region of the fin field effect transistor and the metal sulfide layer has a hexagonal or triangular crystal structure arranged in a two-dimensional geometry;
   a first gate electrode structure on the metal sulfide layer and across the top and side walls of the fin part; and
   a source electrode layer and a drain electrode layer on both sides of the first gate electrode structure respectively.

20. The fin field effect transistor of claim 19, further comprising:
   a transition layer covering the metal sulfide layer; and
   a second gate electrode structure on the metal sulfide layer and across the top and side walls of the fin part.

* * * * *